United States Patent
Sharon et al.

(10) Patent No.: US 8,370,561 B2
(45) Date of Patent: Feb. 5, 2013

(54) RANDOMIZING FOR SUPPRESSING ERRORS IN A FLASH MEMORY

(75) Inventors: Eran Sharon, Rishon Lezion (IL); Idan Alrod, Tel Aviv (IL)

(73) Assignee: Sandisk IL Ltd., Kfar Saba (IL)

( * ) Notice: Subject to any disclaimer, the term of this patent is extended or adjusted under 35 U.S.C. 154(b) by 711 days.

(21) Appl. No.: 11/808,905

(22) Filed: Jun. 13, 2007

(65) Prior Publication Data

US 2008/0215798 A1 Sep. 4, 2008

Related U.S. Application Data

(60) Provisional application No. 60/871,820, filed on Dec. 24, 2006.

(51) Int. Cl.
*G06F 12/02* (2006.01)

(52) U.S. Cl. .................................. 711/103; 711/165

(58) Field of Classification Search .................. 711/103, 711/154, 165; 365/185.02, 185.09, 185.33, 365/185.32; 713/161, 162, 189, 193, 190
See application file for complete search history.

(56) References Cited

U.S. PATENT DOCUMENTS

| | | | |
|---|---|---|---|
| 4,993,029 A | 2/1991 | Galbraith et al. | |
| 5,404,485 A | 4/1995 | Ban | |
| 5,434,825 A | 7/1995 | Harari | |
| 5,712,863 A | 1/1998 | Gray | |
| 5,937,425 A | 8/1999 | Ban | |
| 6,279,133 B1 | 8/2001 | Vafai et al. | |
| 6,522,580 B2 | 2/2003 | Chen et al. | |
| 6,549,446 B2 * | 4/2003 | Morley et al. | 365/97 |
| 6,574,774 B1 * | 6/2003 | Vasiliev | 714/800 |
| 6,591,330 B2 | 7/2003 | Lasser | |
| 6,684,289 B1 | 1/2004 | Gonzalez et al. | |
| 7,155,015 B2 * | 12/2006 | Katayama et al. | 380/267 |
| 7,480,851 B2 | 1/2009 | Chang et al. | |
| 7,509,556 B2 | 3/2009 | Naganathan et al. | |
| 2002/0093356 A1 | 7/2002 | Williams et al. | |
| 2002/0099904 A1 * | 7/2002 | Conley | 711/103 |
| 2003/0046631 A1 * | 3/2003 | Gappisch et al. | 714/763 |
| 2005/0213393 A1 | 9/2005 | Lasser | |
| 2006/0095703 A1 * | 5/2006 | Ferraiolo et al. | 711/170 |
| 2006/0129751 A1 | 6/2006 | Guterman et al. | |
| 2006/0181934 A1 | 8/2006 | Shappir et al. | |
| 2006/0227974 A1 * | 10/2006 | Haraszti | 380/280 |
| 2006/0248427 A1 * | 11/2006 | Katayama et al. | 714/746 |
| 2007/0271491 A1 * | 11/2007 | Tung et al. | 714/752 |

FOREIGN PATENT DOCUMENTS

EP 1130600 9/2001

OTHER PUBLICATIONS

U.S. Appl. No. 11/797,379, filed May 2007, Map Erase State PD.
International Search Report and Written Opinion of International Application No. PCT/IL2007/001514, dated May 6, 2008, 12 pages.
Non-Final Office Action dated Feb. 16, 2011, issued in U.S. Appl. No. 11/808,906, 8 pages.
Office Action dated Jun. 7, 2011 issued in Taiwanese Patent Application No. 096148250, with English translation, 16 pages.
Notice of Allowance and Fee(s) Due Dated Jun. 21, 2011, issued in U.S. Appl. No. 11/808,906, 6 pages.

\* cited by examiner

*Primary Examiner* — Jared Rutz
(74) *Attorney, Agent, or Firm* — Toler Law Group, PC

(57) ABSTRACT

Original data to be stored in a nonvolatile memory are first randomized while preserving the size of the original data. In response for a request for the original data, the randomized data are retrieved, derandomized and exported without authenticating the requesting entity. ECC encoding is applied either before or after randomizing; correspondingly, ECC decoding is applied either after or before derandomizing.

19 Claims, 9 Drawing Sheets

FIGURE 4
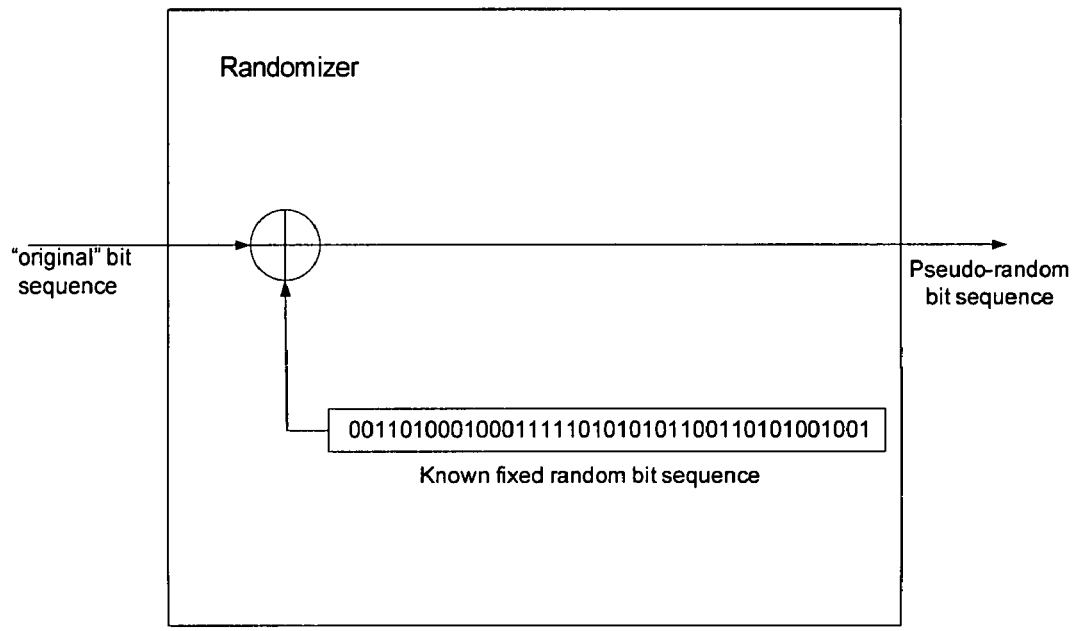
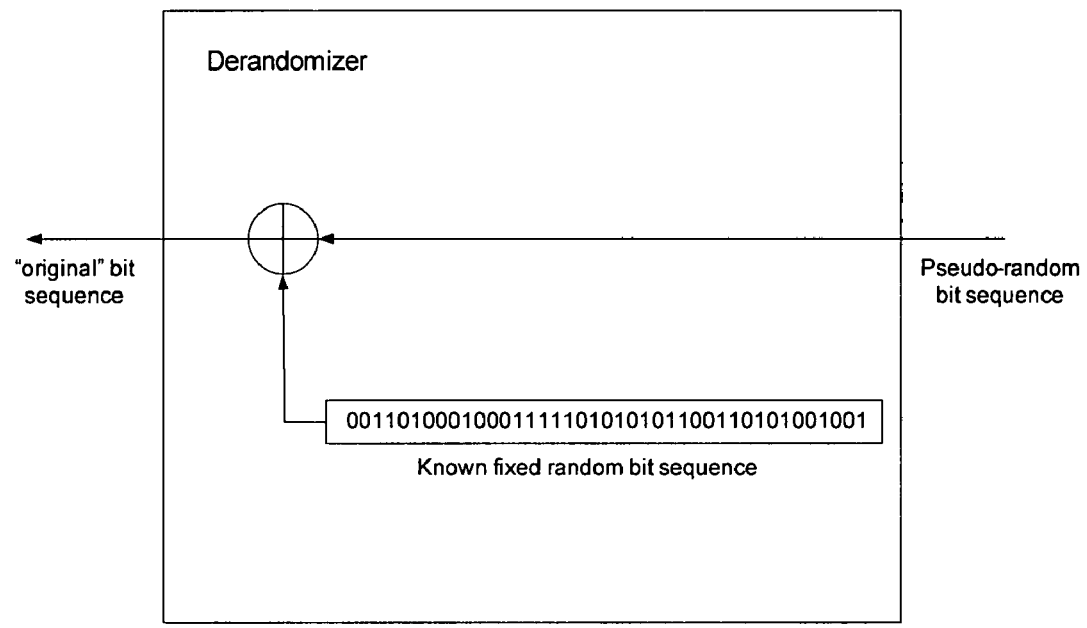

FIGURE 5

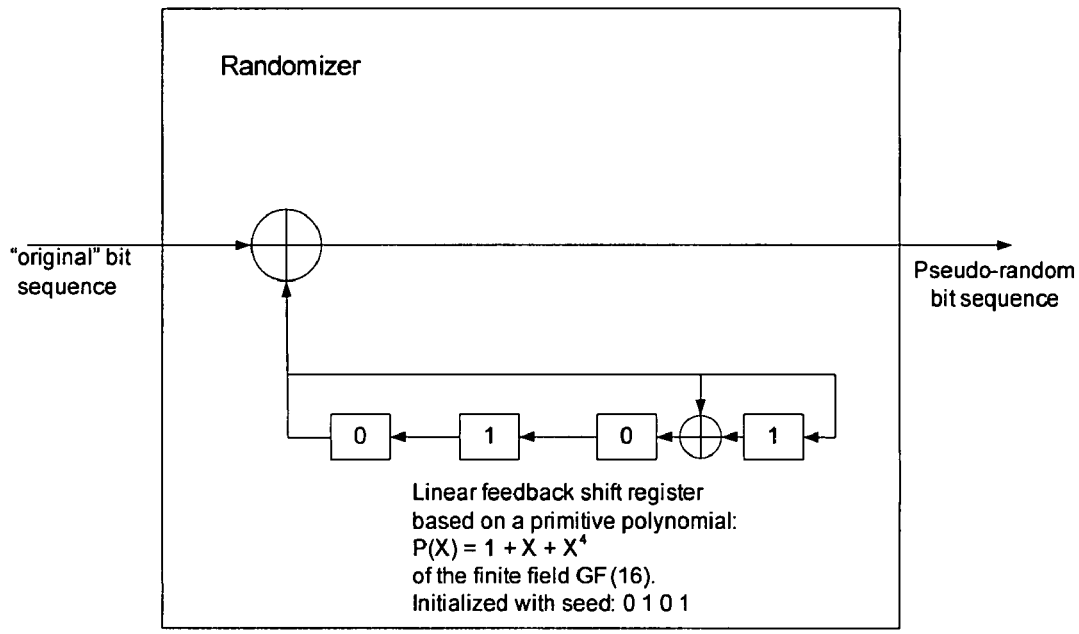

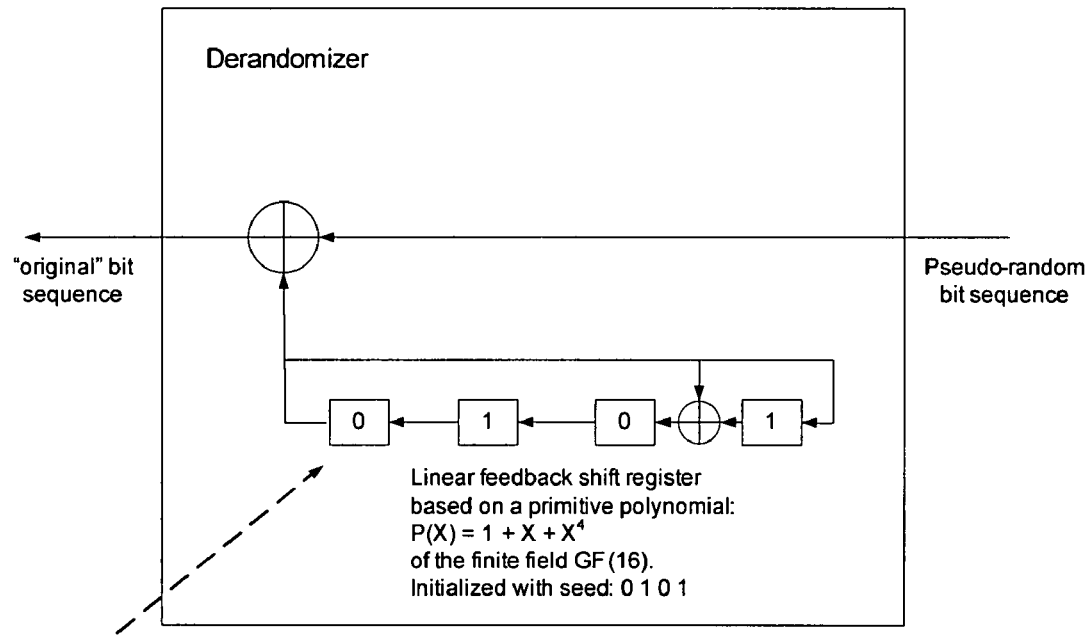

The contents of the shift register will repeat it self every 16 clocks. Each clock, the contents of the shift register will represent a different element of the 16 elements in the finite field GF(16).
In order to obtain better randomness, a larger shift register should be used, representing a larger finite field. For example, if we use a length 32 shift register, representing a primitive polynomial of GF($2^{32}$), then the contents of the shift register will only repeat itself every $2^{32}$ clcoks.

FIGURE 6

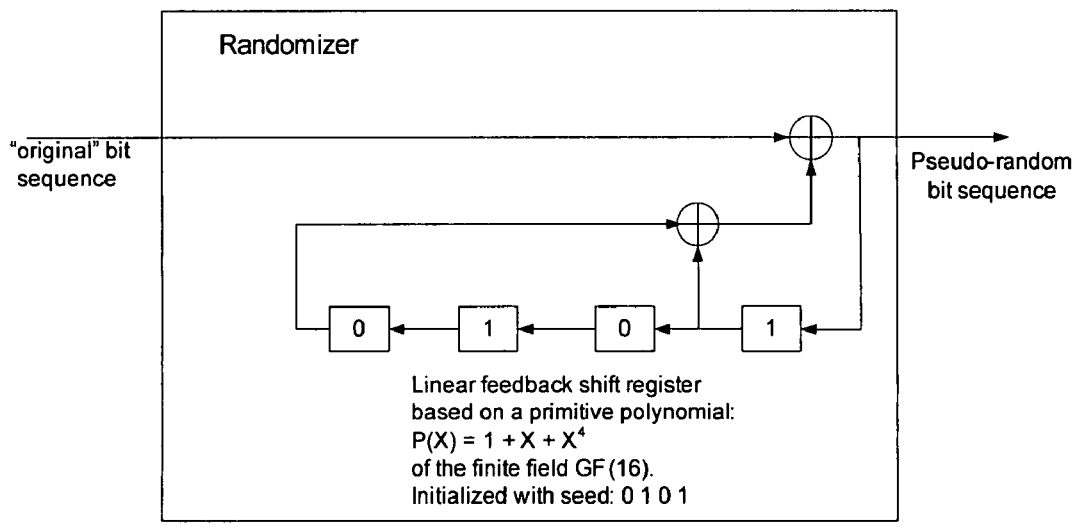

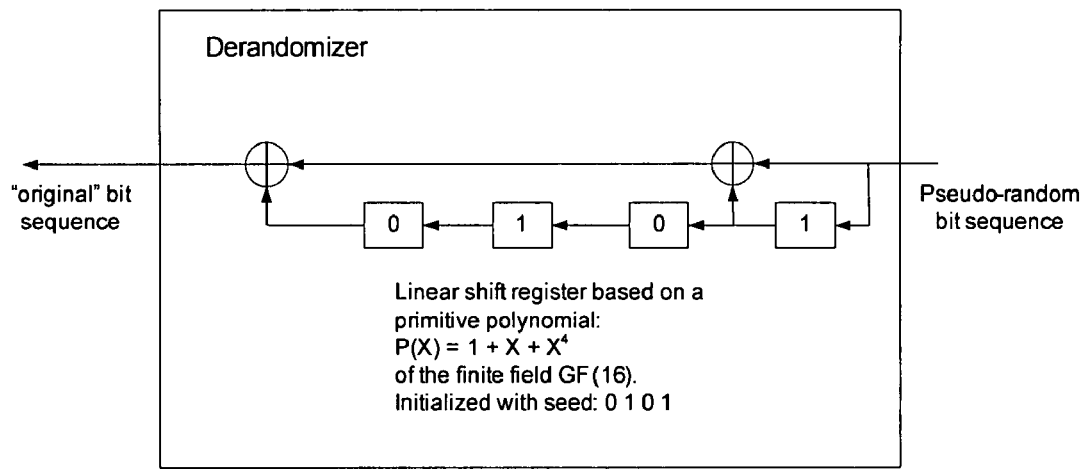

Let I(X) denote the polynomial representing the "original" bit sequence concatenated with the seed bit sequence. The randomizer generates a bit sequence corresponding to the polynomial R(X) = I(X)*1/P(X). The derandomizer generates a bit sequence corresponding to the polynomial R(X)*P(X) = I(X), i.e. it generates the "original" bit sequence.
(A polynomial $A(X) = a_0 + a_1X + a_nX^n$ represents the bit sequence $[a_0\ a_1\ ...\ a_n]$).

ns are needed.

RANDOMIZING FOR SUPPRESSING ERRORS IN A FLASH MEMORY

This patent application claims the benefit of U.S. Provisional Patent Application No. 60/871,820, filed Dec. 24, 2006.

This application is related to U.S. patent application Ser. No. 11/808,906 of the same inventors, which is entitled "FLASH MEMORY DEVICE AND SYSTEM WITH RANDOMIZING FOR SUPPRESSING ERRORS" and filed on the same day as the present application. The latter application, also claiming priority from U.S. Provisional Patent Application No. 60/871,820, filed Dec. 24, 2006, is incorporated in its entirety as if fully set forth herein.

FIELD AND BACKGROUND OF THE INVENTION

The present invention relates generally to flash memory storage systems. Specifically, the present invention relates to a flash memory storage system in which the flash memory is capable of storing multiple bits per memory cell, and in which certain disturbance effects are minimized.

Flash memory devices have been known for many years. Typically, each cell within a flash memory stores one bit of information. Traditionally, the way to store a bit has been by supporting two states of the cell—one state represents a logical "0" and the other state represents a logical "1". In a flash memory cell the two states are implemented by having a floating gate above the cell's channel (the area connecting the source and drain elements of the cell's transistor), and having two valid states for the amount of charge stored within this floating gate. Typically, one state is with zero charge in the floating gate and is the initial unwritten state of the cell after being erased (commonly defined to represent the "1" state) and another state is with some amount of negative charge in the floating gate (commonly defined to represent the "0" state). Having negative charge in the gate causes the threshold voltage of the cell's transistor (i.e. the voltage that has to be applied to the transistor's control gate in order to cause the transistor to conduct) to increase. Now it is possible to read the stored bit by checking the threshold voltage of the cell—if the threshold voltage is in the higher state then the bit value is "0" and if the threshold voltage is in the lower state then the bit value is "1". Actually there is no need to accurately read the cell's threshold voltage—all that is needed is to correctly identify in which of the two states the cell is currently located. For that purpose it suffices to make a comparison against a reference voltage value that is in the middle between the two states, and thus to determine if the cell's threshold voltage is below or above this reference value.

FIG. 1A shows graphically how this works. Specifically, FIG. 1A shows the distribution of the threshold voltages of a large population of cells. Because the cells in a flash device are not exactly identical in their characteristics and behavior (due, for example, to small variations in impurity concentrations or to defects in the silicon structure), applying the same programming operation to all the cells does not cause all of the cells to have exactly the same threshold voltage. (Note that, for historical reasons, writing data to a flash memory is commonly referred to as "programming" the flash memory. The terms "writing" and "programming" are used interchangeably herein.) Instead, the threshold voltage is distributed similar to the way shown in FIG. 1A. Cells storing a value of "1" typically have a negative threshold voltage, such that most of the cells have a threshold voltage close to the value shown by the left peak of FIG. 1A, with some smaller numbers of cells having lower or higher threshold voltages. Similarly, cells storing a value of "0" typically have a positive threshold voltage, such that most of the cells have a threshold voltage close to the value shown by the right peak of FIG. 1A, with some smaller numbers of cells having lower or higher threshold voltages.

In recent years a new kind of flash device has appeared on the market, using a technique conventionally called "Multi Level Cells" or MLC for short. (This nomenclature is misleading, because the previous type of flash cells also has more than one level: they have two levels, as described above. Therefore, the two kinds of flash cells are referred to herein as "Single Bit Cells" (SBC) and "Multi-Bit Cells" (MBC).) The improvement brought by the MBC flash is the storing of two bits in each cell. (In principle MBC also includes the storage of more than two bits per cell. In order to simplify the explanations, the two-bit case is emphasized herein. It should however be understood the present invention is equally applicable to flash memory devices that support more than two bits per cell.) In order for a single cell to store two bits of information the cell must be able to be in one of four different states. As the cell's "state" is represented by its threshold voltage, it is clear an MBC cell should support four different valid ranges for its threshold voltage. FIG. 1B shows the threshold voltage distribution for a typical MBC cell. As expected, FIG. 1B has four peaks, each corresponding to one of the states. As for the SBC case, each state is actually a range of threshold voltages and not a single threshold voltage. When reading the cell's contents, all that must be guaranteed is that the range that the cell's threshold voltage is in is correctly identified. For a prior art example of an MBC flash device see U.S. Pat. No. 5,434, 825 to Harari.

When encoding two bits in an MBC cell as one of the four states, it is common to have the left-most state in FIG. 1B (typically having a negative threshold voltage) represent the case of both bits having a value of "1". (In the discussion below the following notation is used—the two bits of a cell are called the "lower bit" and the "upper bit". An explicit value of the bits is written in the form ["upper bit" "lower bit"], with the lower bit value on the right. So the case of the lower bit being "0" and the upper bit being "1" is written as "10". One must understand that the selection of this terminology and notation is arbitrary, and other names and encodings are possible). Using this notation, the left-most state represents the case of "11". The other three states are illustrated as assigned in the following order from left to right— "10", "00", "01". One can see an example of an implementation of an MBC NAND flash device using such encoding as described above in U.S. Pat. No. 6,522,580 to Chen, which patent is incorporated by reference for all purposes as if fully set forth herein. See in particular FIG. 8 of the Chen patent. It should be noted though that the present invention does not depend on this assignment of the states, and there are other ordering that can be used. When reading an MBC cell's content, the range that the cell's threshold voltage is in must be identified correctly; only in this case this cannot always be achieved by comparing to one reference voltage, and several comparisons may be necessary. For example, in the case illustrated in FIG. 1B, one way to read the lower bit is first to compare the cell's threshold voltage to a reference comparison voltage $V_1$ and then, depending on the outcome of the comparison, to compare the cell's threshold voltage to either a zero reference comparison voltage or a reference comparison voltage $V_2$. Another way to read the lower bit is to compare the cell's threshold voltage unconditionally to both the zero reference voltage and $V_2$. In either case, two comparisons are needed.

MBC devices provide a great advantage of cost—using a similarly sized cell one stores two bits rather than one. However, there are also some drawbacks to using MBC flash—the average read and write times of MBC memories are longer than of SLC memories, resulting in lower performance. Also, the reliability of MBC is lower than SBC. This can easily be understood—the differences between the threshold voltage ranges in MBC are much smaller than in SBC. Thus, a disturbance in the threshold voltage (e.g. leaking of the stored charge causing a threshold voltage drift, interference from operations on neighboring cells, etc.) that may have gone unnoticed in SBC because of the large gap between the two states, might cause an MBC cell to move from one state to another, resulting in an erroneous bit. The end result is a lower quality specification of MBC cells in terms of data retention time or the endurance of the device to many write/erase cycles. Thus there are advantages to using both MBC cells and SBC cells, and the selection can be different depending on the application's requirements.

While the above explanations deal with floating-gate flash memory cells, there are other types of flash memory technologies. For example, in the NROM flash memory technology there is no conductive floating gate but instead there is an insulating layer trapping the electric charge. The present invention is equally applicable to all flash memory types, even though the explanations herein are given in the context of floating-gate technology.

There are several sources of errors in flash memory devices. As mentioned above, one such source is the leakage of electrons out of the gate of a memory cell that might shift the cell's originally written state into another, incorrect state, resulting in one or more bit errors when reading the cell. The present invention is mainly concerned with a specific source of error commonly called "Program Disturb" or "PD" for short. Unlike the leakage-type effect that results in slow accumulation of errors over long time periods in which data is stored in the flash device, the PD effect results in an immediate appearance of errors, immediately following the writing of data into the cells of the device.

The PD effect causes cells, that are not intended to be written, to unintentionally move from their initial left-most state to some other state. (The explanations herein assume the common practice, also used in FIGS. 1A and 1B, of drawing the threshold voltage axis such that its left direction represents lower values. This is an arbitrary practice and should not be construed to limit the scope of the present invention in any way). Referring to the two-bit-per-cell example of FIG. 1B, cells that are in the leftmost state corresponding to bit values of "11" (or in other words, to the cell's erased state) and that are supposed to remain in such state, are found to be in the next-to-leftmost state of "10", resulting in one bit out of the two bits stored in such cells to be incorrect. In some cases, especially in cells storing more than two bits per cell and having more than four states, PD effects might turn out not only as a move from the leftmost state to its immediately adjacent state, but also as a move from the leftmost state to more distant states, and also as a move from a state that is not the leftmost state to another state to its right (i.e. having a higher threshold voltage). However, the case described first above of moving from the leftmost state to its immediately adjacent neighboring state is the most common, and will be used herein for all examples and explanations without limiting the generality of the methods of the present invention.

By way of background for a discussion of the reason for the PD effect, FIG. 2, which is identical to FIG. 1 of the Chen patent, is a block diagram of a typical prior art flash memory device. A memory cell array 1 including a plurality of memory cells M arranged in a matrix is controlled by a column control circuit 2, a row control circuit 3, a c-source control circuit 4 and a c-p-well control circuit 5. Column control circuit 2 is connected to bit lines (BL) of memory cell array 1 for reading data stored in the memory cells (M), for determining a state of the memory cells (M) during a program operation, and for controlling voltage levels of the bit lines (1L) to promote the programming or to inhibit the programming. Row control circuit 3 is connected to word lines (WL) to select one of the word lines (WL), to apply read voltages, to apply programming voltages combined with the bit line voltage levels controlled by column control circuit 2, and to apply an erase voltage coupled with a voltage of a p-type region on which the memory cells (M) are formed. C-source control circuit 4 controls a common source line connected to the memory cells (M). C-p-well control circuit 5 controls the c-p-well voltage. Typically, in a NAND flash device, the cells controlled by one word line correspond to one or two pages of the device, and the word lines are organized into blocks, with each block typically including a number of word lines that is a moderate power of 2, e.g., $2^5=32$. A page is the smallest unit of a NAND flash device whose cells can be programmed together. A block is the smallest unit of a NAND flash device whose cells can be erased together.

The data stored in the memory cells (M) are read out by column control circuit 2 and are output to external I/O lines via an I/O line and a data input/output buffer 6. Program data to be stored in the memory cells are input to data input/output buffer 6 via the external I/O lines, and are transferred to the column control circuit 2. The external I/O lines are connected to a controller 20.

Command data for controlling the flash memory device are input to a command interface connected to external control lines that are connected with controller 20. The command data informs the flash memory of what operation is requested. The input command is transferred to a state machine 8 that controls column control circuit 2, row control circuit 3, c-source control circuit 4, c-p-well control circuit 5 and data input/output buffer 6. State machine 8 call output a status data of the flash memory such as READY/BUSY or PASS/FAIL.

Controller 20 is connected or connectable with a host system such as a personal computer, a digital camera, a personal digital assistant. It is the host that initiates commands, such as to store or read data to or from memory array 1, and provides or receives such data, respectively. Controller 20 converts such commands into command signals that can be interpreted and executed by command circuits 7. Controller 20 also typically contains buffer memory for the user data being written to or read from memory array 1. A typical memory system includes one integrated circuit chip 21 that includes controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

The reason for the PD effect is easy to understand when reviewing the voltages applied to the cells of a NAND flash device when programming a page. When programming a page of cells, a relatively high voltage is applied to the word line connected to the control gates of the cells of the page. What decides whether a certain cell threshold voltage is increased as a result of this control gate voltage is the voltage applied to the bit line connected to that cell. A cell that is not to be written with data (that is—that is to remain erased, representing an all-one state), has its bit line connected to a relatively high voltage level that minimizes the voltage difference across the cell. A cell that is to be written has its bit line connected to low voltage, causing a large voltage difference across the cell, and resulting in the cell's threshold voltage getting increased, thus moving the cell to the right on the voltage axis of FIG. 1B and causing the cell's state to change.

However, even though cells that are not meant to be written have a lower voltage difference across them than cells that are meant to be written, the cells that are not to be written still have some voltage difference across them. If the page to be written has some cells that are written to high threshold voltages (for example, to the rightmost state), then the voltage difference across non-programmed cells gets higher. This is because all control gates of all cells of the page get the same voltage applied to them, and the higher the threshold voltage to be reached, the higher is that voltage. Therefore the need to apply higher control gate (i.e. word line) voltage to some cells results in higher voltage differences at the non-programmed cells. Even though the cells are designed with the goal of not being affected by such anticipated voltage differences, in actual NAND flash devices such voltage differences stress the cells and might result in some of the cells changing their state even though this was neither intended nor desired.

To summarize the above explanation, PD is an effect in which when programming a page of cells, some cells that are intended to remain in the leftmost erased state end up in another state, resulting in bit errors when reading those cells.

PD effects can be empirically and statistically measured, and counter-measures in the form of error correction schemes may be applied to handle them. Flash device manufacturers are aware of this source of potential errors, and they take it into account when recommending to their customers the level of error correction the customers should use. So when a manufacturer of a two-bit-per-cell MBC flash device recommends a 4-bit ECC scheme (meaning that every 512 bytes of user data should be protected against the occurrence of up to four bit errors), he may base this recommendation on a statistical analysis that assumes a random data pattern stored into the device and on the probability that a PD-type error will occur under such circumstances. Obviously, other error sources and types are also taken into account in such calculations.

Unfortunately, typical real-life user data is not random. Measurements on real-life user files show that the various possible states of the cells do not have equal probability to occur. As the leftmost state of the cells is the default value of cells not being written to, this state is the most frequent. This is easy to understand—a section of memory not initialized, or not used within a file, very often corresponds to cells in the erased state.

As a result, in real-life applications the problem of PD errors is more severe than what is expected based on random data patterns statistical calculations. Relatively many cells will be in the erased state that is the most vulnerable state to PD errors, and therefore more PD errors than are predicted by random data distribution models will actually occur.

Note that even though we emphasize the PD effect as an error source that depends on the user data stored in a flash memory, there are other such error sources. For example, the Back Pattern (BP) phenomenon, which is a result of different bit lines BL having different resistances, also is data dependent. The resistance of a bit line depends on the data stored in the cells along the bit line, i.e. the resistance of a bit line depends on the actual states or voltage levels of the cells along the bit line. The different bit line resistances result in different bit line currents. This can cause different voltage level sensing during the reading of two cells in two different bit lines, even if these two cells are programmed to the exact same voltage level (i.e. the two cells have exactly the same threshold voltage). As a result the error probabilities of such two cells are different and are user-data-dependent.

Obviously, such a dependency between the flash block or page error rates and the user data stored in the flash memory is not desirable. Certain "worst case" user data patterns may have much higher error rates than others. This makes it hard to estimate the FCC requirements needed for protecting the stored data. Moreover, as explained above, real-life, non-random user data tend to suffer from higher error rates than random data due to phenomena such as PD.

There is thus a widely recognized need for, and it would be highly advantageous to have, a flash memory device that is more reliable than prior art flash memory devices in the sense of being less vulnerable to data dependent errors due to phenomena such as PD or BP.

Definitions

A random sequence is a sequence with no recognizable patterns or regularities. No element of the sequence can be predicted from knowing other elements of the sequence. Hence, "randomization" is defined herein as an operation that increases the randomness of a highly nonrandom sequence of bits. In other words, the bits of a sequence that has been "randomized" are less easily predictable from the other bits of the sequence than are the bits of the sequence prior to randomization. Note that because the randomization processes of the present invention are deterministic, the output sequences of these processes are predictable and so are not truly random but only "pseudorandom", in the sense that the patterns or regularities of the output sequences are harder to recognize, and preferably are much harder to recognize, than the patterns or regularities of the input sequences. Hence, the "randomized" sequences recited in the appended claims are pseudorandom sequences, not true random sequences.

One special case of randomization is "scrambling". Scrambling is an invertible transformation of an input bit sequence to an output bit sequence, such that each bit of the output bit sequence is a function of several bits of the input bit sequence and of an auxiliary bit sequence.

The inverse of randomization is "derandomization". The inverse of scrambling is "descrambling".

"Randomizing" is defined similarly for sets of states of memory cells. A first set of states of memory cells is "randomized" relative to a second set of states of the same memory cells if the bit sequence that is represented by the cells when the cells are programmed to the first set of states is more random than the bit sequence that is represented by the cells when the cells are programmed to the second set of states. Preferably, the various memory cell states appear in approximately equal numbers in a "randomized" set of memory cell states.

A "nonrandom" bit sequence is a bit sequence with recognizable patterns and/or regularities. A "nonrandom" set of memory cell states is a set of cell states with recognizable patterns and/or regularities and/or having a non-uniform induced distribution over the cell states.

SUMMARY OF THE INVENTION

According to the present invention there is provided a device for storing data, including: (a) a nonvolatile memory;

and (b) a controller, of the nonvolatile memory, operative: (i) to randomize original data to be stored in the memory while preserving a size of the original data, thereby providing randomized data, (ii) to store the randomized data in the memory, and (iii) in response to a request for the original data by an entity external to the device: (A) to retrieve the randomized data from the memory, and (B) to derandomize the retrieved randomized data, thereby providing retrieved data substantially identical to the original data, and (C) to export the retrieved data to the entity without authenticating the entity.

According to the present invention there is provided a device for storing data, including: (a) a memory that includes: (i) an array of nonvolatile memory cells, and (ii) circuitry operative: (A) to randomize original data that are to be stored in the memory cells while preserving a size of the original data, thereby providing randomized data, (B) to store the randomized data in at least a portion of the memory cells, (C) to retrieve the randomized data from the at least portion of the memory cells, and (D) to derandomize the retrieved randomized data, thereby providing retrieved data substantially identical to the original data; and (b) a controller operative: (i) in response to a request for the original data from an entity external to the device, to export the retrieved data to the entity without authenticating the entity.

According to the present invention there is provided a system for storing data, including: (a) a first nonvolatile memory; (b) a second nonvolatile memory wherein is stored a driver for the first nonvolatile memory, the driver including: (i) code for randomizing original data to be stored in the first nonvolatile memory while preserving a size of the original data, thereby providing randomized data, (ii) code for storing the randomized data in the first nonvolatile memory, and (iii) code for responding to a request for the original data by: (A) retrieving the randomized data from the first nonvolatile memory, (B) derandomizing the retrieved randomized data, thereby providing retrieved data substantially identical to the original data, and (C) exporting the retrieved data without authenticating the request; and (c) a processor for executing the code of the driver.

According to the present invention there is provided a computer-readable storage medium having computer-readable code embedded thereon, the computer readable code being driver code for a memory device, the computer-readable code including: (a) program code for randomizing original data to be stored in a memory of the memory device while preserving a size of the original data, thereby providing randomized data; (b) program code for storing the randomized data in the memory; and (c) program code for responding to a request for the original data by: (i) retrieving the randomized data from the memory, (ii) derandomizing the retrieved randomized data, thereby providing retrieved data substantially identical to the original data, and (iii) exporting the retrieved data without authenticating the request.

According to the present invention there is provided a device for storing data, including: (a) a nonvolatile memory having a sufficient number of memory cells to store original data by programming the memory cells to a set of corresponding states of the memory cells; and (b) a controller, of the nonvolatile memory, operative: (i) to map the original data into a set of states of all the memory cells that is randomized relative to the set of corresponding states, (ii) to instruct the memory to program the memory cells to the randomized set of states, and (iii) in response to a request for the original data by an entity external to the device: (A) to read the memory cells, thereby providing retrieved randomized data, (B) to derandomize the retrieved randomized data, thereby providing retrieved data substantially identical to the original data, and (C) to export the retrieved data to the entity without authenticating the entity.

According to the present invention there is provided a device for storing data, including: (a) a memory that includes: (i) a sufficient number of memory cells to store original data by programming the memory cells to a set of corresponding states of the memory cells, and (ii) circuitry operative: (A) to map the original data into a set of states of all the memory cells that is randomized relative to the set of corresponding states, (B) to program the memory cells to the randomized set of states, (C) to read the memory cells, thereby providing retrieved randomized data, and (D) to derandomize the retrieved randomized data, thereby providing retrieved data substantially identical to the original data; and (b) a controller operative, in response to a request for the original data from an entity external to the device, to export the retrieved data to the entity without authenticating the entity.

According to the present invention there is provided a system for storing data, including: (a) a first nonvolatile memory having a sufficient number of memory cells to store original data by programming the memory cells to a set of corresponding states of the memory cells; (b) a second nonvolatile memory wherein is stored a driver for the first nonvolatile memory, the driver including: (i) code for mapping the original data into a set of states of all the memory cells that is randomized relative to the set of corresponding states, (ii) code for instructing the first nonvolatile memory to program the memory cells to the randomized set of states, and (iii) code for responding to a request for the original data by: (A) instructing the first nonvolatile memory device to read the memory cells, thereby providing retrieved randomized data, (B) derandomizing the retrieved randomized data, thereby providing retrieved data substantially identical to the original data, and (C) exporting the retrieved data without authenticating the request; and (c) a processor for executing the code of the driver.

According to the present invention there is provided a computer-readable storage medium having computer-readable code embedded thereon, the computer-readable code being driver code for a memory device that includes a sufficient number of memory cells to store original data by programming the memory cells to a set of corresponding states of the memory cells, the computer-readable code including: (a) program code for mapping the original data into a set of states of all the memory cells that is randomized relative to the set of corresponding states; (b) program code for instructing the memory device to program the memory cells to the randomized set of states; and (c) program code for responding to a request for the original data by: (i) instructing the memory device to read the memory cells, thereby providing retrieved randomized data, (ii) derandomizing the retrieved randomized data, thereby providing retrieved data substantially identical to the original data, and (iii) exporting the retrieved data without authenticating the request.

According to the present invention there is provided a method of storing data, including the steps of: (a) randomizing original data while preserving a size of the original data, thereby providing randomized data; (b) storing the randomized data in a nonvolatile memory; and (c) in response to a request for the original data: (i) retrieving the randomized data from the memory, (ii) derandomizing the retrieved randomized data, thereby providing retrieved data substantially identical to the original data, and (iii) exporting the retrieved data to an entity from which the request is received without authenticating the entity.

According to the present invention there is provided a method of storing data, including the steps of: (a) providing a sufficient number of memory cells to store original data by programming the memory cells to a set of corresponding states of the memory cells; (b) mapping the original data into a set of states of all the memory cells that is randomized relative to the set of corresponding states; (c) programming the memory cells to the randomized set of states; and (d) in response to a request for the original data: (i) reading the memory cells, thereby providing retrieved randomized data, (ii) derandomizing the retrieved randomized data, thereby providing retrieved data substantially identical to the original data, and (iii) exporting the retrieved data to an entity from which the request was received without authenticating the entity.

The scope of the present invention includes two basic devices and a basic system for storing data.

The first basic device includes a nonvolatile memory and a controller. The controller randomizes original data that are to be stored in the memory, while preserving the size of the original data, thereby providing randomized data. The controller stores the randomized data in the memory. In response to a request for the original data from an entity (e.g. a host of the device) external to the device, the controller retrieves the randomized data from the memory and derandomizes the retrieved randomized data, thereby providing retrieved data substantially identical to the original data. It is greatly preferred that the retrieved data be strictly identical to the original data, but this can not be guaranteed in all cases, because e.g. of errors, in reading the data, that are not corrected by error correction decoding. The retrieved data are exported to the entity without authenticating the entity.

That the size of the original data is preserved distinguishes the device of the present invention from similar prior art devices that compress data to be stored in their memories. Data compression can be construed as a form of at least partial randomization, but data compression, by its very nature, reduces the size of the data being compressed. That the entity that requests the original data is not authenticated distinguishes the device of the present invention from similar prior art devices that encrypt, thereby at least partially randomizing, data to be stored in their memories but that require some form of authentication, such as presentation of a password or such as presentation of the key originally used for encryption, to receive, in decrypted form, data read from their memories.

The second basic device includes a memory and a controller. The memory includes an array of nonvolatile memory cells and circuitry that performs the randomization, storage, retrieval and derandomization functions of the controller of the first basic device. The controller performs the authentication-free export of the retrieved data that is performed by the controller of the first basic device.

Preferably, either controller applies error correction encoding to the original data prior to the randomization and applies error correction decoding to the retrieved data prior to exporting the retrieved data. Alternatively, the controller of the first device applies error correction encoding to the randomized data prior to storing the randomized data and applies error correction decoding to the retrieved randomized data prior to derandomization. The error correction encoding may be either systematic encoding, in which error correction bits are appended to the encoded data to produce a codeword, or nonsystematic encoding, in which the data being encoded are not recognizable in the codeword.

Preferably, the randomization includes summing the original data, modulo 2, with a fixed, random bit sequence or with a pseudorandom bit sequence, and the derandomization includes summing the retrieved randomized data, modulo 2, with the random bit sequence or with the pseudorandom bit sequence. In some embodiments of the present invention, the pseudorandom bit sequence is fixed. In other embodiments of the present invention, the pseudorandom bit sequence is generated by the controller of the first device or by the circuitry of the second device, for example using a linear feedback shift register whose seed either is fixed or is a function of the unit number of the unit, from among units into which the memory is partitioned, in which the randomized data is stored. For example, if the memory is a flash memory, the units may be blocks of the flash memory or pages of the flash memory.

Alternatively, the randomization includes scrambling the original data and the derandomization includes descrambling the retrieved randomized data. For example, in the second device, the circuitry includes a scrambler block for performing the scrambling and a descrambler block for performing the descrambling. Most preferably, the scrambling and descrambling are effected using respective linear feedback shift registers that share a common seed. In some embodiments of the present invention, the seed is fixed. In other embodiments of the present invention, the seed is a function of the unit number of the unit, from among units into which the memory is partitioned, in which the randomized data are stored. For example, if the memory is a flash memory, the units may be blocks of the flash memory or pages of the flash memory.

A basic system of the present invention includes a first nonvolatile memory, a second nonvolatile memory, and a processor. In the second nonvolatile memory is stored a driver that includes code that is executed by the processor to emulate the controller of the first device of the present invention. In the context of a system of the present invention, the entity that requests the original data typically is a user application running on the system and executing commands, for programming and reading the first nonvolatile memory, that are supported by the driver.

Functional components of various embodiments of the present invention such as the linear feedback shift registers, may be implemented in hardware, firmware, software or combinations thereof.

The scope of the present invention also includes, as a method, the methods used by the devices and the system of the present invention for storing data. The scope of the present invention also includes a computer-readable storage medium having embedded thereon computer-readable code for the driver of the system of the present invention.

From another point of view, the method of the present invention is a method of storing original data in a sufficient number of memory cells to be programmed to a set of corresponding states of the memory cells. For example, 512 SBC flash cells or 256 four-state MBC flash cells can be programmed to store 512 bits of data. The original data are mapped into a set of states of all the cells (all 512 SBC cells or all 256 MBC cells in the example) that is randomized relative to the set of corresponding states. The memory cells then are programmed to the randomized set of states rather than to the original set of corresponding states. That the numbers of states in the two sets are identical distinguishes the method of the present invention, from this point of view, from similar prior art methods in which the data are stored in compressed form in fewer memory cells than would be needed to store the same data in uncompressed form. As described below, the preferred method of mapping the original data into the randomized set of memory cell states is by randomizing the original data.

Preferably, the various memory cell states occur in the randomized set of states in substantially equal numbers.

BRIEF DESCRIPTION OF THE DRAWINGS

The invention is herein described, by way of example only, with reference to the accompanying drawings, wherein:

FIG. 4 illustrates exemplary randomizer and derandomizer blocks that use a fixed random sequence of bits;

FIG. 5 illustrates exemplary randomizer and derandomizer blocks that use a pseudorandom sequence of bits generated by a liner feedback shift register;

FIG. 6 illustrates exemplary scrambler and descrambler blocks;

DESCRIPTION OF THE PREFERRED EMBODIMENTS

Figure 1:
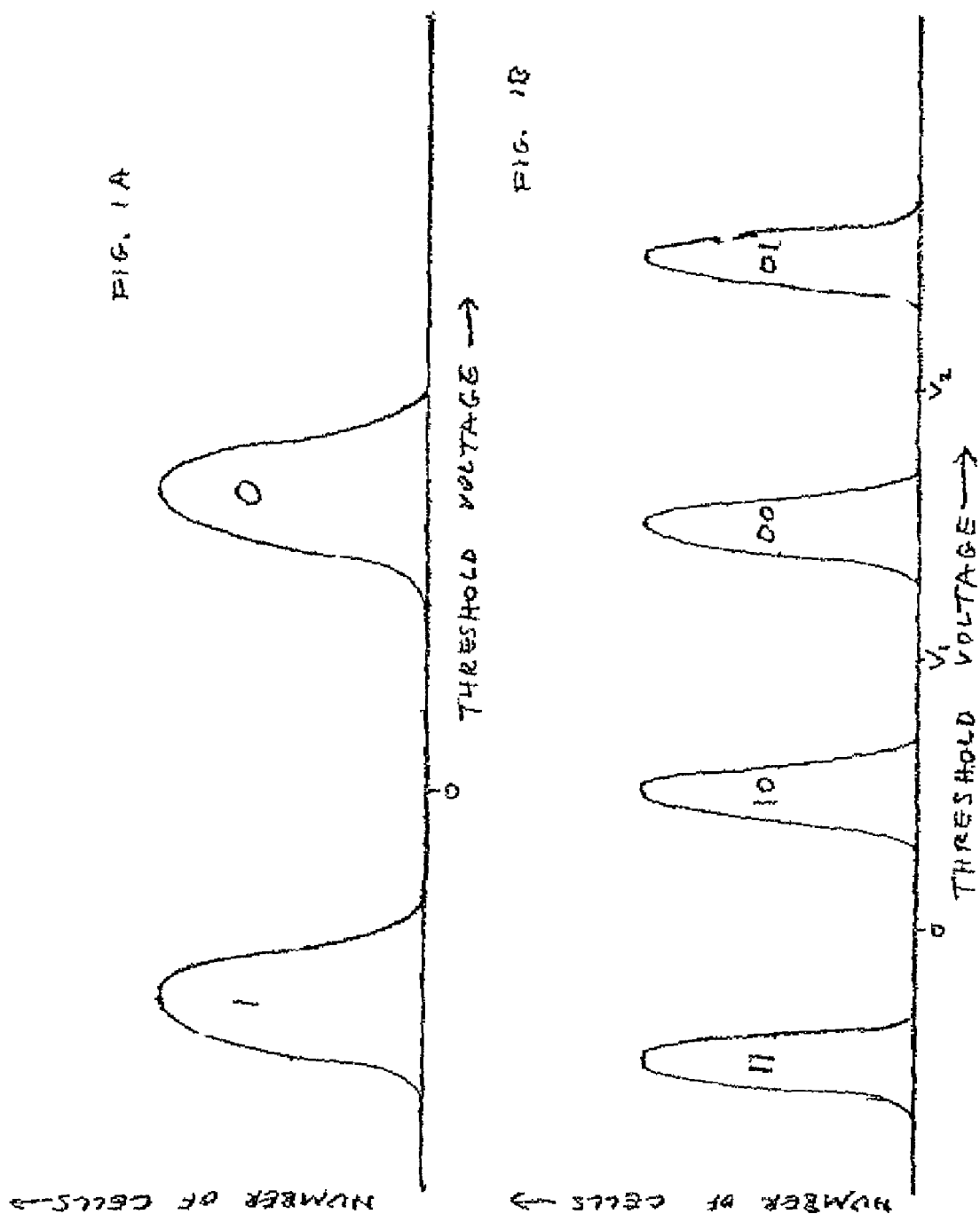
FIG. 1A illustrates the threshold voltage distributions of flash cells programmed in 1-bit mode.
FIG. 1B illustrates the threshold voltage distributions of flash cells programmed in 2-bit mode.

The device of the present invention is a multi-bit-per-cell flash memory storage device that eliminates or reduces the dependency between the user data stored in the flash and the raw flash error rates (before ECC decoding). This is done by transforming the user data bits into a pseudorandom bit sequence that then is programmed into the flash memory. As a result, the probability of problematic ("worst case") bit patterns, which cause high block or page error rates, becomes negligible and is practically reduced to zero. The advantages are obvious: 1) the reliability of the flash memory is not driven by certain worst case user data patterns, which are very hard to determine. 2) the reliability of the flash memory in real-life scenarios, in which such worst case user data patters are more frequent, improves 3) the ECC requirements become easier to evaluate. 4) lower ECC redundancy is required and the flash memory cost efficiency (in terms of cells per information bit) improves. The reason for this is that we do not need to handle worst case error rates that have practically zero probability of occurring. We only need to handle the expected error rates of the flash memory under the assumption that random bit sequences are programmed into the flash memory.

A method for combating data dependent errors specifically caused by the PD effect is presented in U.S. patent application Ser. No. 11/797,379, filed on May 3, 2007. The method is based on changing the mapping from bits to voltage levels, such that the erase state is switched with another state. Note that this can be implemented without changing the actual mapping used by the flash memory. Instead, one can have the controller of the flash memory artificially flip certain bits before programming and than flip those bits again upon reading. For example, flipping all the bits would result in programming of cells that were originally supposed to store the all 1's state (i.e. the erase state) to be programmed into the all 0's state. The disadvantage of this approach is that it does not solve the problem of data dependent errors in general. It deals only with a very specific scenario of PD errors in the erase state. Moreover, even for this specific case the suggested solution is not optimal, because switching the erase state with an alternative state makes the alternative state vulnerable to PD errors. For example, consider the previous example, in which we flip all the bits such that the all 1's and all 0's states are switched. Then if the user data contains large sequences of 0's, the programmed page will still suffer from many PD-related errors.

The method of the present invention solves the problem of data dependent errors in a much more general way. Enumerating all the problematic data patterns is a very hard (and probably infeasible) task because such an enumeration requires complete understanding of the various physical phenomena occurring in the flash memory and a complete statistical characterization of the user application that generates the data in order to determine which data patterns are stored more frequently than others. Hence, instead of dealing with specific data patterns that are problematic with respect to a specific phenomenon such as PD, the method of the present invention reduces the probability of any pattern practically to zero by making sure that the bit sequences written to the flash memory are pseudorandom.

Figure 3A:
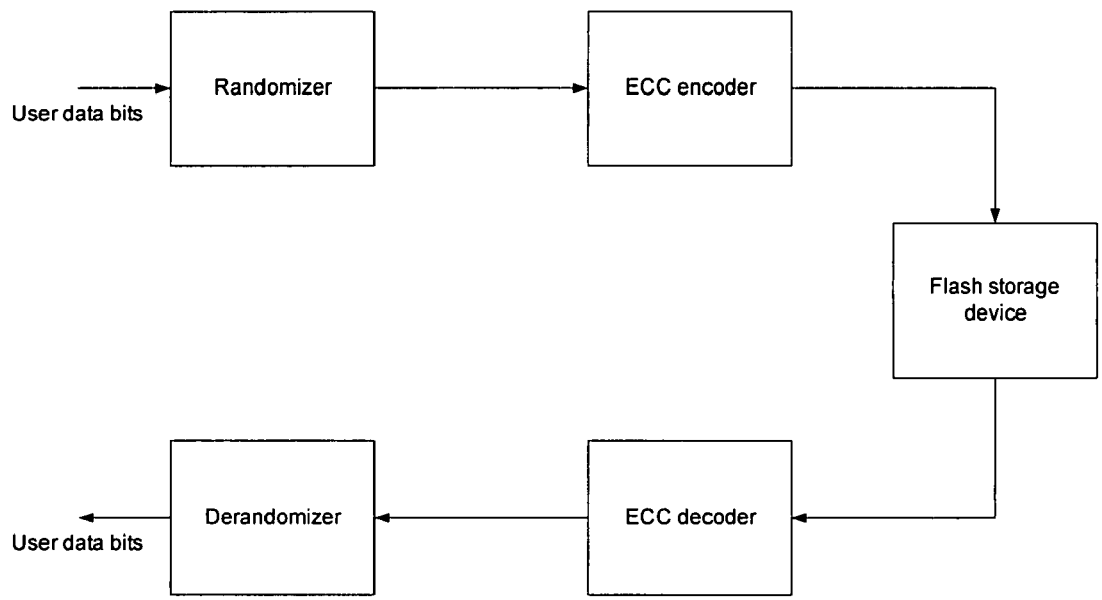
FIGS. 3A and 3B are schematic block diagrams of randomizing/derandomizing and ECC encoding/decoding according to the present invention.
Figure 3B:
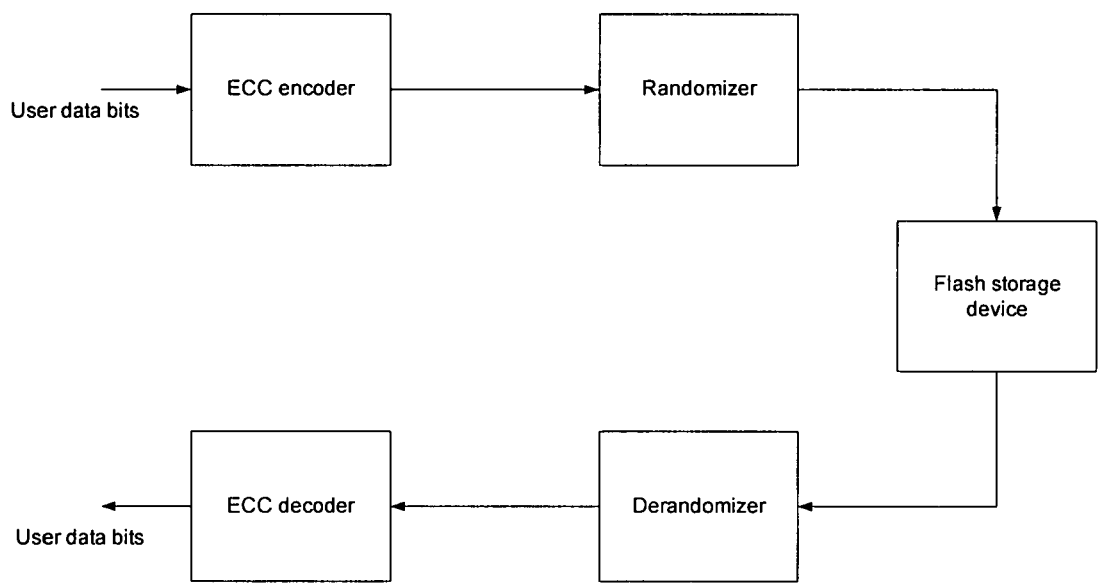

In some embodiments of the present invention, transformation of the user data bits into a pseudo-random bit sequence is done using a randomizer block (implemented in hardware, firmware or software), according to one of several methods known in the art. The transformation needs to be invertible. The inverse transformation is done using a derandomizer block. The transformation can be done either on the user data bits, before ECC encoding (as shown in FIG. 3A) or on the encoded user data bits after ECC encoding (as shown in FIG. 3B). In the first case, the user data bits can be recovered by performing the inverse transformation on the bit sequence that is read from the flash memory after the bit sequence is decoded using an ECC decoder (as shown in FIG. 3A). In the second case, the inverse transformation is performed directly on the bit sequence that is read from the flash memory. The resulting bit sequence is then decoded using an ECC decoder in order to recover the user data bits (as shown in FIG. 3B).

According to one embodiment of the present invention, the randomization is performed by summing the user data bits modulo 2 with a fixed random sequence of bits or with a fixed pseudorandom sequence of bits. The resulting randomized bit sequence is ECC encoded (if needed) and then programmed into the flash memory. Upon reading the flash memory, the read bit sequence is decoded via an ECC decoder (if needed). The user data bits are recovered by derandomizing the decoded, error free, bit sequence by summing the bit sequence modulo 2 with the known fixed random or pseudo-random bit sequence. An example of the randomizer and derandomizer blocks according to this embodiment is shown in FIG. 4.

According to another embodiment of the present invention, the randomization is performed by summing the ECC encoded user data bits modulo 2 with a fixed random sequence of bits or with a fixed pseudorandom sequence of bits. The resulting randomized bit sequence is then programmed into the flash memory. Upon reading the flash memory, the read bit sequence is derandomized by summing the read bit sequence modulo 2 with the known fixed random or pseudorandom bit sequence. The user data bits are then recovered by ECC decoding the derandomized bit sequence. An example of the randomizer and derandomizer blocks according to this embodiment also is shown in FIG. 4.

According to another embodiment of the present invention, the randomization is performed by summing the user data bits modulo 2 with a pseudo-random sequence of bits. The pseudorandom sequence of bits is generated, for example, using a linear feedback shift register. As is known in the art, in order to obtain "good" randomness the feedback shift register is constructed according to a primitive polynomial of a sufficiently large finite field (a Galois field) (S. Golomb, *Shift Register Sequences*, Agean Park Press, Laguna Hills Calif. USA, 1982). The resulting randomized sequence of bits is ECC encoded (if needed) and then programmed into the flash memory. Upon reading the flash memory, the read bit sequence is decoded using an ECC decoder (if needed). The user data bits are recovered by derandomizing the decoded, error free bit sequence by summing the bit sequence modulo 2 with the same pseudo-random bit sequence that was used during programming. For example, when using a feedback shift register for generation of the pseudorandom bit sequence, the same bit sequence is obtained during programming and reading by using the same seed for initialization of the feedback shift register, i.e. by initializing the feedback shift register with the same sequence of bits.

According to another embodiment of the present invention, the randomization is performed by summing the ECC encoded user data bits modulo 2 with a pseudo-random sequence of bits. The randomized bit sequence is then programmed into the flash. Upon reading the flash memory, the read bit sequence is derandomized by summing the bit sequence modulo 2 with the same pseudo-random bit sequence that was used during programming. The user data bits are then recovered by ECC decoding of the derandomized bit sequence. An example of the randomizer and derandomizer blocks according to this embodiment also is shown in FIG. 5.

There are various options for determining the seed used for initialization of the pseudo-random bit sequence generator. For example, the seed can be constant. Alternatively, the seed can be a function of the unit number of the block or page of the flash memory in which the data are stored. An example of the randomizer and derandomizer blocks according to this embodiment is shown in FIG. 5.

Care must be taken when the seed is a function of unit number, because most flash memory devices perform "garbage collection", during the course of which the number of the unit where data are stored changes. One common form of garbage collection is motivated by the fact that once a flash page has been programmed, the page must be erased before being reprogrammed, and erasing is done a block at a time, not a page at a time. A flash block, all of whose pages have been programmed, usually contains some pages with current data and other pages with data that have been superceded by more recently programmed data. To recover this block for further programming, the current data pages are copied to a different block and then the old block is erased. The new block has a different block number than the old block. Normally, the pages to which the current data are copies have different page numbers than the pages from which the current data are copied. In order for the seed used to initialize the feedback register to be the same for both programming and reading, the change in unit number associated with such garbage collection must be taken into account.

One way to ensure that the same seed is used for both programming and reading is to always derandomize data that are to be moved to a new page or to a new block and to rerandomize the data, possibly using a different seed, when writing the data to the new page or to the new block. Another way to ensure that the same seed is used for both programming and reading is to always move data to a new page or to a new block such that the function of unit number that produces the seed produces the same seed for both the old unit number and the new unit number. For example, if the function "page number modulo 8" is used to generate the seed, the garbage collection should always copy a page of data to a new page whose page number, in binary notation, has the same last three bits as the page number of the old page. Another way to ensure that the same seed is used for both programming and reading is to store the seed along with the data. For example, each page of a NAND flash memory typically includes a main portion that is used to store data and a management portion that is used to store management information. A typical size of such a page is 528 bytes: 512 bytes for storing data and 16 bytes for storing management information. The seed that is used to generate the pseudo-random sequence for randomizing data stored in the main portion of a page is stored in the management portion of the page. Under this alternative, the cells that store the seed should be excluded from the randomization process, to guarantee that the seed is read correctly for derandomizing.

In a flash memory device that has a "flash file system", logical page addresses can be used as seeds for generating pseudo-random sequences. A flash file system provides a system of data storage and manipulation on a flash memory device that allows the device to emulate a magnetic disk. A flash file system enables applications or operating systems interact with a flash memory device not using physical addresses but rather using logical addresses (sometimes called virtual addresses). An intermediary software layer between the software application and the physical memory system provides a mapping between logical addresses and physical addresses. Some systems that implement logical-to-physical address mapping are described in U.S. Pat. No. 5,404,485 to Ban, in U.S. Pat. No. 5,937,425 to Ban and in U.S. Pat. No. 6,591,330 to Lasser, all three of which patents are incorporated by reference for all purposes as if fully set forth herein. Because the host of the flash memory system associates a specific logical address with a specific chunk of data, such a logical address, having been used to generate a seed for initializing the feedback register for programming the data, is guaranteed to be available to be used to generate the same seed for initializing the feedback register for reading the data.

According to another embodiment of the present invention, the randomization is performed by passing the user data bits through a scrambler block. The scrambler can be implemented using a linear feedback shift register. As is known in the art, in order to obtain "good" randomness the feedback shift register is constructed according to a primitive polynomial of some large enough finite field (a Galois field) (S. Golomb, ibid.). The linear feedback shift register is initialized with a predefined seed. The seed can be constant or a function of the unit number of the page or block of the flash memory where the data is stored, or any other parameter that is known when the data are read. The resulting pseudo-random sequence of bits at the output of the scrambler is ECC encoded (if needed) and then programmed into the flash memory. Upon reading the flash memory, the read bit sequence is decoded using an FCC decoder (if needed). The user data bits are then recovered by derandomizing the decoded, error free bit sequence using a descrambler block initialized with the same seed as the one used in the scrambler block during programming. When the scrambler block is implemented by a linear feedback shift register that is constructed based on a polynomial, the descrambler block preferably is implemented as linear shift register representing the inverse polynomial. An example of the randomizer and derandomizer blocks according to this embodiment is shown in FIG. 6.

According to another embodiment of the present invention, the randomization to is performed by passing the ECC encoded user data bits through a scrambler block. One way to implement the scrambler is using a linear feedback shift register, initialized with a predefined seed. The resulting pseudo-random sequence of bits at the output of the scrambler is programmed into the flash memory. Upon reading the flash memory, the read bit sequence is derandomized using a descrambler block initialized with the same seed as the one used in the scrambler block during programming. When the scrambler block is implemented by a linear feedback shift register that is constructed based on a polynomial, the descrambler block preferably is implemented as linear shift register representing the inverse polynomial. The user data bits are then recovered by ECC decoding of the derandomized bit sequence. An example of the randomizer and derandomizer blocks according to this embodiment also is shown in FIG. 6. Considerations regarding the interaction of a seed based on unit number with garbage collection are the same as in the case of a randomizer block based on a linear feedback shift register, as discussed above.

Note that the first approach to scrambling and descrambling, in which scrambling is performed before ECC encoding and descrambling is performed after FCC decoding, is preferred over the second approach in which scrambling is performed after ECC encoding and descrambling is performed before ECC decoding. This is because if the bit sequence read from a flash memory contains errors, these errors could be propagated by the descrambling, resulting in an increased number of errors in the descrambled sequence and consequently a more difficult error correction job for the ECC decoding if the ECC decoding follows the descrambling.

There could be various other implementations of the randomization and derandomization blocks besides the ones mentioned here. In the above examples, the randomization is performed serially, bit by bit. Alternatively the randomization is parallelized, such that the randomizer/derandomizer blocks output several bits simultaneously. In all cases, the pseudo-random bit sequence produced by the randomization block has as many bits as the original bit sequence that is input to the randomization block. This is an aspect of the present invention that distinguishes the present invention from prior art compression that also randomizes the input data to a certain extent but also outputs fewer bits than are in the input data.

It should be noted that the above method of applying a transformation to the data bits assumes that the flash memory is being programmed. When a flash page is erased all of the cells of the page are set to the left-most state or voltage level (as illustrated in FIGS. 1A and 1B) and all the cells are assumed to contain the fixed all-1's data pattern. This might cause a confusion with a page that was actually programmed to the all-1's bit sequence, but that, according to the present invention, represents some other data bit sequence. However, this can be handled by the application using the flash memory device being able to distinguish a page that was not written yet from a page that was written. This is easy to do and is well known in the prior art of flash management systems, for example by allocating one or more flag cells, in the management portion of a page, that are always written as part of the page programming operation, and thus if found to be in the leftmost state, indicate an unwritten page. So a page found to be unwritten is interpreted according to the standard prior art logic, while a page found to be written is interpreted according to the methods of the present invention.

Note that the idea of a translation stage in which logical bit values that are to be stored in a storage device are translated into physical values that are the ones actually stored also is described in the prior art elsewhere than in U.S. Ser. No. 11/797,379. This idea is taught in US Patent Application Publication No. 2005/0213393 to Lasser. However, not only is the translation of Lasser '393 done for a completely different purpose than the purpose of the present invention, but the translation of Lasser '393 lacks the specific feature that makes the translation of the present invention useful. The essential characteristic of the type of translation used in the present invention is that all states of a cell become equally likely to occur, regardless of the user data stored in the cell, such that the errors become data-independent. In Lasser '393 the purpose of the translation is to even out distribution of errors, and not to eliminate data dependency. Indeed, all the transformation examples shown in Lasser '393 do not achieve the purpose of the present invention.

Gonzalez et al., in U.S. Pat. No. 6,684,289, also teaches mapping between logical bit values and physical bit values when writing and reading a flash memory, for the purpose of avoiding repeated programming of static patterns of data (see column 6 lines 28-47). Not only does Gonzalez et al. '289 have nothing to do with minimizing the probability of data dependent errors such as PD errors of the stored bits, but Gonzalez et al. '289 also apply a time-varying transformation such that the same logical data value is transformed to different physical states at different times, as otherwise the goal of avoiding repeated programming of static data patterns is not achieved. The present invention, on the other hand, has no requirement that the transformation be time-dependent (even though it may be time-dependent, provided there is a way to make sure that at the time of reading the original data can be recovered by a corresponding reverse transformation).

It should also be noted that while the above explanations of the operation of flash memory cells assumes that a cell storing N bits has exactly $2^N$ possible different states (represented by different ranges of its threshold voltage) and that an erase operation brings the cell to the leftmost (lowest voltage) state which also represents one of the $2^N$ data values, there are flash memory devices in which this is not the case. In such devices the erased state is different from all data states. Specifically, the erased state has a more negative threshold voltage than any of the data states. In such devices whenever writing data into the cell, even if the data is the all-ones value, the cell is programmed (that is—its threshold voltage is increased) to reach the state corresponding to the data value. In other words, the erased state is different than the all-ones state, unlike the devices previously referred to. Even though the above explanations of the present invention were given in the context of the first type of devices, the invention is also equally applicable to the second type of devices.

The methods of the present invention can be implemented either by software or by hardware. More specifically, the randomizing of the data during programming and the derandomizing of the data during reading can be implemented by executing software code or by electrical circuitry (such as inverter gates). If the randomizing and derandomizing are implemented by software, they may be implemented either by software executed on the host computer which writes or reads the data (for example, within the software device driver supporting the storage device), or they may be implemented by firmware executed within the memory controller (e.g. controller 20 of FIG. 2) that interacts with the host computer and controls the memory media. If the randomizing and derandomizing are implemented by hardware, they may be implemented either in the memory controller or within the memory media (e.g. in command circuits 7 of FIG. 2). This applies whether the memory controller and the memory media are two separate dies or reside on a common die. All the above configurations and variations are within the scope of the present invention.

Figure 2:
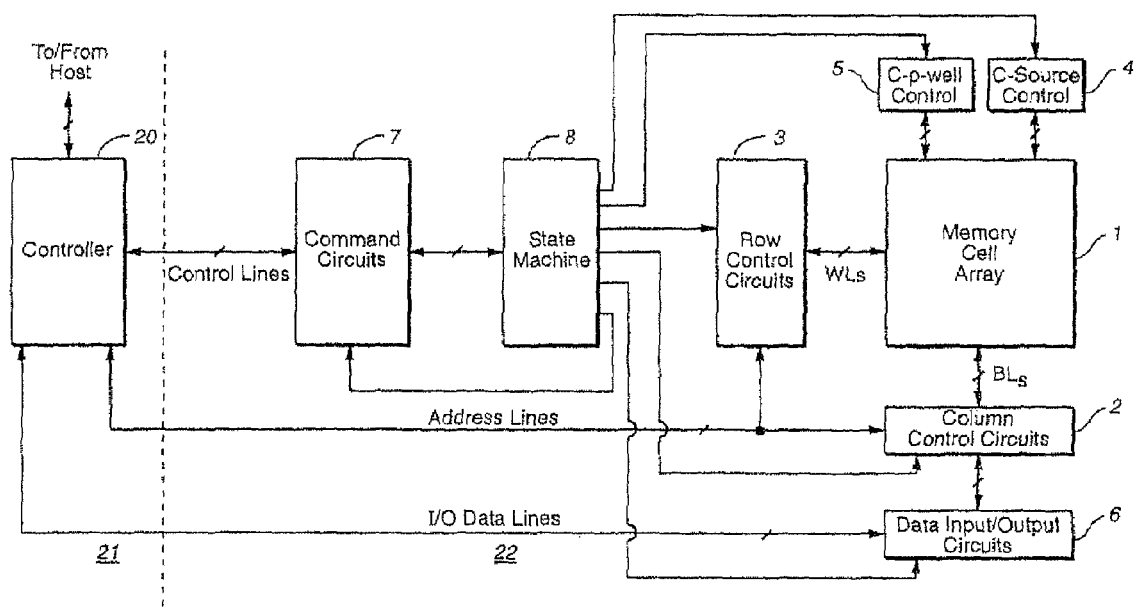
FIG. 2 is a block diagram of a flash memory device.

Thus, in addition to illustrating a typical prior art flash memory device, FIG. 2 also illustrates two kinds of embodiments of a flash memory device of the present invention. In the first kind of embodiment, that performs ECC encoding before randomization and ECC decoding after randomization as in FIG. 3B, controller 20 performs the ECC encoding and decoding and command circuits 7 perform the randomization and the derandomization. In a second kind of embodiment, that performs ECC encoding/decoding and randomization/derandomization either in the order shown in FIG. 3A or in the order shown in FIG. 3B, controller 20 performs both ECC encoding/decoding and randomization/derandomization. In both kinds of embodiments, controller 20, upon receiving a read command from the host of the flash memory device, exports the read data to the host without requiring the host to authenticate itself. In other words, the host is not required to prove to controller 20 that the host is authorized to receive the read data in order for controller 20 to send the read data to the host.

Figure 7:
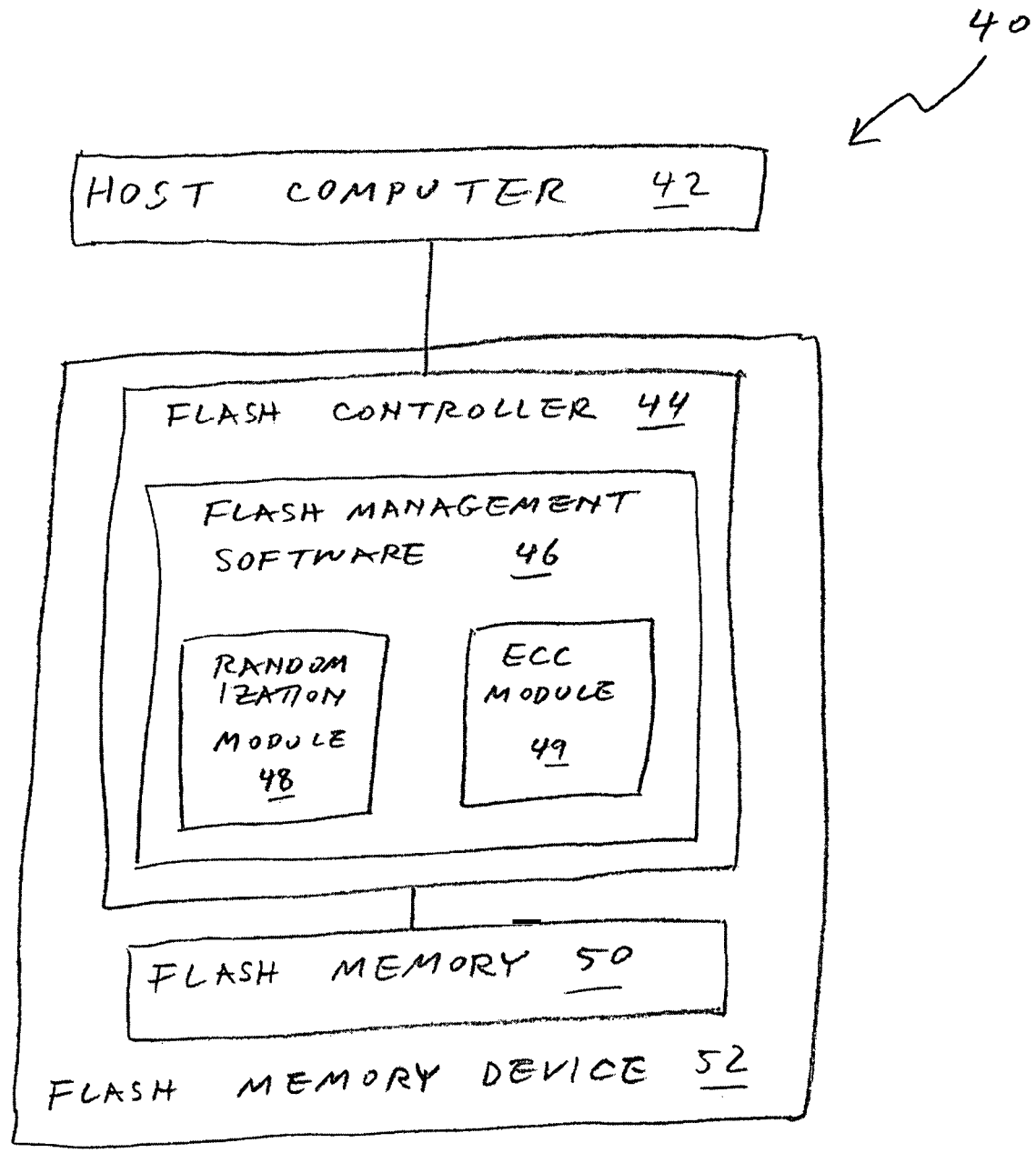
FIGS. 7-9 are high-level block diagrams of systems of the present invention.
Figure 8:
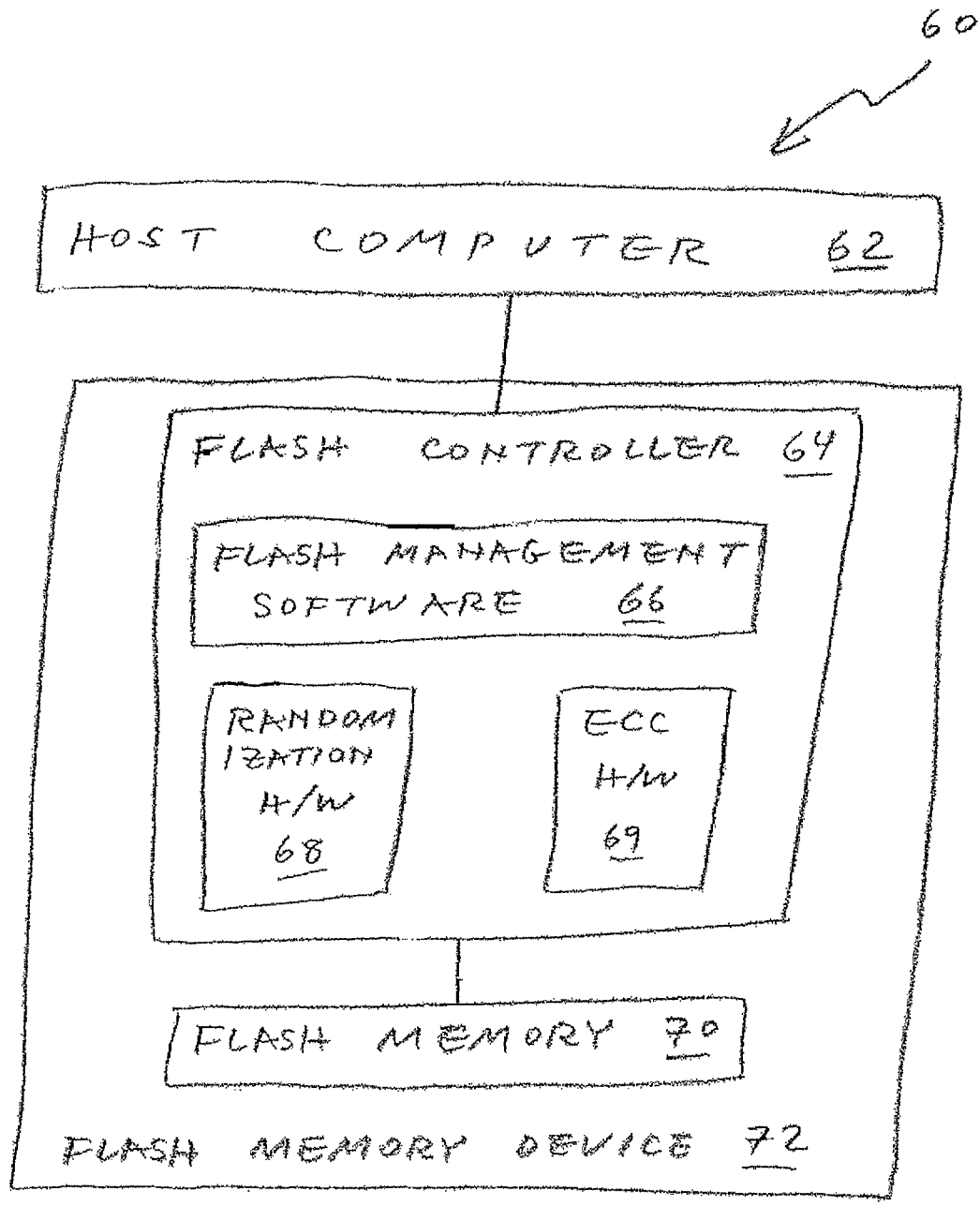

FIGS. 7 and 8 are high-level block diagrams of two systems 40 and 60 that include flash memory device embodiments of the second kind. In system 40 a host computer 42 sends read and write instructions to a flash memory device 52 of the present invention. Flash memory device 52 uses a flash controller 44 to manage a flash memory 50 by executing flash management software 46. Flash management software 46 includes a randomization module 48 and a ECC module 49 for performing randomization/derandomization and ECC encoding/decoding, as discussed above, either in the order shown in FIG. 3A or in the order shown in FIG. 3B. In system 60, a host computer sends read and write instructions to a flash memory device 72. Flash memory device 72 uses a flash controller 64 to manage a flash memory 70 by executing flash management software 66. Flash controller 64 also includes randomization hardware 68 and ECC hardware 69 for performing randomization/derandomization and ECC encoding/decoding, as discussed above, either in the order shown in FIG. 3A or in the order shown in FIG. 3B.

Figure 9:
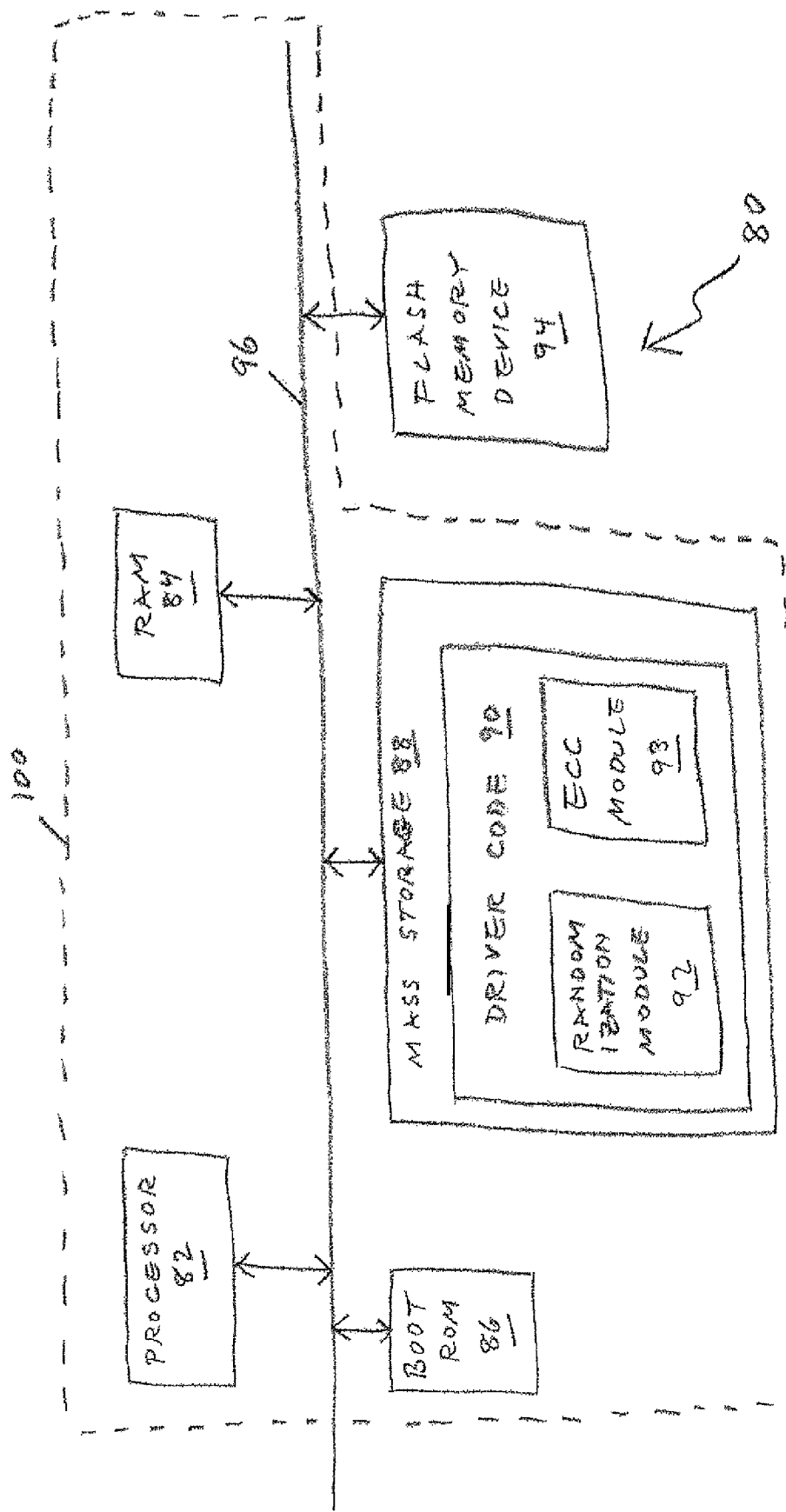

FIG. 9 is a high-level block diagram of another system 80 of the present invention. System 80 includes a processor 82 and four memory devices: a RAM 84, a boot ROM 86, a mass storage device (hard disk) 88 and a prior art flash memory device 94, all communicating via a common bus 60. Flash memory driver code 90 is stored in mass storage device 88 and is executed by processor 82 to interface between user applications executed by processor 82 and flash memory device 94, and to manage the flash memory of flash memory device 94. Driver code 90 includes a randomization module 92 and a ECC module 93 for performing randomization/derandomization and ECC encoding/decoding, as discussed above, either in the order shown in FIG. 3A or in the order shown in FIG. 3B. A user application that reads data from flash memory device 94 is not required by driver code 90 to authenticate itself in order to receive the requested data. Driver code 90 typically is included in operating system code for system 80 but also could be freestanding code.

The components of system 80 other than flash memory device 94 constitute a host 100 of flash memory device 94. Mass storage device 88 is an example of a computer-readable storage medium bearing computer-readable driver code for implementing the present invention. Other examples of such computer-readable storage media include read-only memories such as CDs bearing such code.

It is within the scope of the present invention to configure a device or system of the present invention, e.g. the devices of FIGS. 2, 7 and 8 and the system of FIG. 9, to require authentication of an entity requesting receipt of only certain data stored in the flash memory of the device or system. For example, flash controller 44 or 64 optionally is configured to allow a user of device 52 or 72 to partition flash memory 50 or 70 between a private partition and a public partition. Access to data stored in the private partition requires authentication such as presentation of a password. Access to data stored in the public partition does not require authentication. Alternatively, flash controller 44 or 64 is configured to support a command, from a privileged user, that switches device 52 or 72 between a secure mode, in which access to data stored in flash memory 50 or 70 requires authentication, and an open mode, in which access to data stored in flash memory 50 or 70 does not require authentication. All the present invention requires with regard to access without authentication is that one of the operational modes of a device or system of the present invention must allow the reading of at least some stored data without requiring the entity that requests the data to authenticate itself.

While the invention has been described with respect to a limited number of embodiments, it will be appreciated that many variations, modifications and other applications of the invention may be made.

What is claimed is:

1. A method comprising:
   randomizing user data to provide randomized user data, wherein the randomizing includes using a seed, wherein the seed is a function of a logical unit address associated with the user data; and
   storing the randomized user data in a first physical unit of a nonvolatile memory; and
   moving the randomized user data from the first physical unit of the nonvolatile memory to a second physical unit of the nonvolatile memory and storing the randomized user data in the second physical unit of the nonvolatile memory.

2. The method of claim 1, wherein randomizing using the seed includes applying a randomizing function to the user data, wherein the randomizing function is functionally dependent on the seed.

3. The method of claim 2, wherein applying the randomizing function includes summing the user data, modulo 2, with a pseudorandom bit sequence generated using the seed.

4. The method of claim 2, wherein the pseudorandom bit sequence is generated by a linear feedback shift register using the seed to generate the pseudorandom bit sequence.

5. The method of claim 1, further comprising after the randomized user data is moved to the second physical unit, when the user data is requested, derandomizing the randomized user data stored in the second physical unit.

6. The method of claim 5, wherein the derandomizing includes applying a derandomizing function to the randomized user data stored at the second physical unit, wherein the derandomizing function is functionally dependent on the seed.

7. The method of claim 6, wherein applying the derandomizing function further includes summing the randomized user data, modulo 2, with a pseudorandom bit sequence generated using the seed.

8. The method of claim 1, wherein the nonvolatile memory is a flash memory and wherein each of the first physical unit and the second physical unit is a block of the flash memory.

9. The method of claim 1, wherein the nonvolatile memory is a flash memory and wherein each of the first physical unit and the second physical unit is a page of the flash memory.

10. A method comprising:
randomizing user data to provide randomized user data, wherein the randomizing includes using a seed value, wherein the seed value is calculated according to a seed-calculating function that functionally depends on a first page number, wherein the first page number is associated with a first page of a nonvolatile memory in which the randomized user data is stored;
storing the randomized user data in the first page; and
moving the randomized user data from the first page to a second page of the nonvolatile memory and storing the randomized user data in the second page, wherein the second page has an associated second page number and wherein a substitution of the second page number instead of the first page number into the seed-calculating function does not change the calculated seed value.

11. The method of claim 10, wherein randomizing using the seed value includes summing the user data, modulo 2, with a pseudorandom bit sequence generated using the seed value.

12. The method of claim 10, further comprising after the randomized user data is moved to the second page, when the user data is requested, derandomizing the randomized user data stored in the second page, wherein the derandomizing uses the seed value.

13. The method of claim 12, wherein the derandomizing the randomized user data includes summing the randomized user data, modulo 2, with a pseudorandom bit sequence generated using the seed value.

14. The method of claim 10, wherein the user data has a first number of data bits and the randomized user data has the first number of randomized data bits.

15. A method comprising:
randomizing user data to provide randomized user data, wherein the randomizing includes using a seed that is a function of a first unit number of a first unit of a nonvolatile memory, wherein the nonvolatile memory is partitioned into a plurality of units and each unit has a corresponding unit number;
storing the seed with the randomized user data in the first unit of the nonvolatile memory;
moving the randomized user data and the seed from the first unit to a second unit of the nonvolatile memory and storing the randomized user data and the seed in the second unit;
after storing the randomized user data and the seed in the second unit, when the user data is requested, derandomizing the randomized user data stored in the second unit, wherein the derandomizing uses the seed stored in the second unit.

16. The method of claim 15, wherein randomizing the user data using the seed includes applying a randomizing function to the user data, wherein the randomizing function is functionally dependent on the seed.

17. The method of claim 15, wherein derandomizing the randomized user data in the second unit using the seed in the second unit includes applying a derandomizing function to the randomized user data in the second unit, wherein the randomizing function is functionally dependent on the seed stored in the second unit.

18. The method of claim 15, wherein the nonvolatile memory is a flash memory and wherein each of the first unit and the second unit is a block of the flash memory.

19. The method of claim 15, wherein the nonvolatile memory is a flash memory and wherein each of the first unit and the second unit is a page of the flash memory.

* * * * *